(12) United States Patent
Chen et al.

(10) Patent No.: US 12,074,074 B2
(45) Date of Patent: Aug. 27, 2024

(54) METHOD AND SYSTEM FOR PROCESSING WAFER

(71) Applicant: TAIWAN SEMICONDUCTOR MANUFACTURING COMPANY LTD., Hsinchu (TW)

(72) Inventors: Po-Ju Chen, Hsinchu (TW); Sheng-Jen Cheng, Tainan (TW); Cha-Hsin Chao, Taipei (TW); Chih-Teng Liao, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 532 days.

(21) Appl. No.: 17/340,114

(22) Filed: Jun. 7, 2021

(65) Prior Publication Data

US 2022/0392811 A1 Dec. 8, 2022

(51) Int. Cl.
| | |
|---|---|
| *H01L 21/66* | (2006.01) |
| *H01J 37/32* | (2006.01) |
| *H01L 21/687* | (2006.01) |
| *G01F 1/00* | (2022.01) |
| *G01N 15/00* | (2006.01) |
| *G01N 15/06* | (2006.01) |
| *G01N 15/075* | (2024.01) |
| *G01P 3/00* | (2006.01) |

(52) U.S. Cl.
CPC ........ *H01L 22/20* (2013.01); *H01J 37/32935* (2013.01); *H01L 21/68742* (2013.01); *G01F 1/00* (2013.01); *G01N 15/00* (2013.01); *G01N 2015/0046* (2013.01); *G01N 15/06* (2013.01); *G01N 15/075* (2024.01); *G01P 3/00* (2013.01); *H01J 37/32715* (2013.01); *H01J 2237/2007* (2013.01); *H01J 2237/202* (2013.01); *H01J 2237/24578* (2013.01); *H01J 2237/24585* (2013.01)

(58) Field of Classification Search
CPC ....................................................... H01L 22/20
See application file for complete search history.

(56) References Cited

U.S. PATENT DOCUMENTS

| | | | | |
|---|---|---|---|---|
| 10,067,070 B2* | 9/2018 | Tedeschi | ................ | G01N 21/94 |
| 10,861,692 B2* | 12/2020 | Wang | .................... | G01B 11/306 |
| 11,735,486 B2* | 8/2023 | Tedeschi | ........... | H01L 21/67253 |
| | | | | 73/865.8 |

(Continued)

FOREIGN PATENT DOCUMENTS

| | | | | | |
|---|---|---|---|---|---|
| CN | 111061129 A | * | 4/2020 | ......... | G03F 7/70925 |
| CN | 111354616 A | * | 6/2020 | | |

(Continued)

*Primary Examiner* — Ryan D Walsh
(74) *Attorney, Agent, or Firm* — WPAT LAW; Anthony King

(57) ABSTRACT

The present disclosure provides a method and a system therefore for processing wafer. The method includes: monitoring a distribution of particles in a chamber while processing the wafer; determining at least one parameter according to the distribution of the particles for configuring at least one device of the chamber; configuring the at least one device of the chamber according to the at least one parameter; and processing another wafer based on a recipe after configuring the at least one device of the chamber.

20 Claims, 13 Drawing Sheets

(56) References Cited

U.S. PATENT DOCUMENTS

| | | | |
|---|---|---|---|
| 2003/0047012 A1* | 3/2003 | Storbeck | G01N 15/06 |
| | | | 73/865.5 |
| 2003/0147075 A1* | 8/2003 | Otsuki | C23C 16/4405 |
| | | | 356/338 |
| 2018/0156727 A1* | 6/2018 | Zhang | H01L 21/67778 |
| 2019/0013205 A1* | 1/2019 | Lee | B24B 37/345 |
| 2020/0020521 A1* | 1/2020 | Wu | H01L 21/68742 |
| 2021/0005436 A1* | 1/2021 | Vaez-Iravani | C23C 14/34 |

FOREIGN PATENT DOCUMENTS

| | | | | |
|---|---|---|---|---|
| KR | 20070064901 A | * | 6/2007 | |
| WO | WO-2014088670 A1 | * | 6/2014 | G05B 19/41875 |

* cited by examiner

METHOD AND SYSTEM FOR PROCESSING WAFER

BACKGROUND

During some semiconductor manufacturing procedures, the semiconductor wafer needs to be processed in the reaction chamber. When the semiconductor wafer is processed, byproduct may be generated and accumulated onto the semiconductor wafer. The accumulations of byproduct may affect the efficiency of processing the semiconductor wafer.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
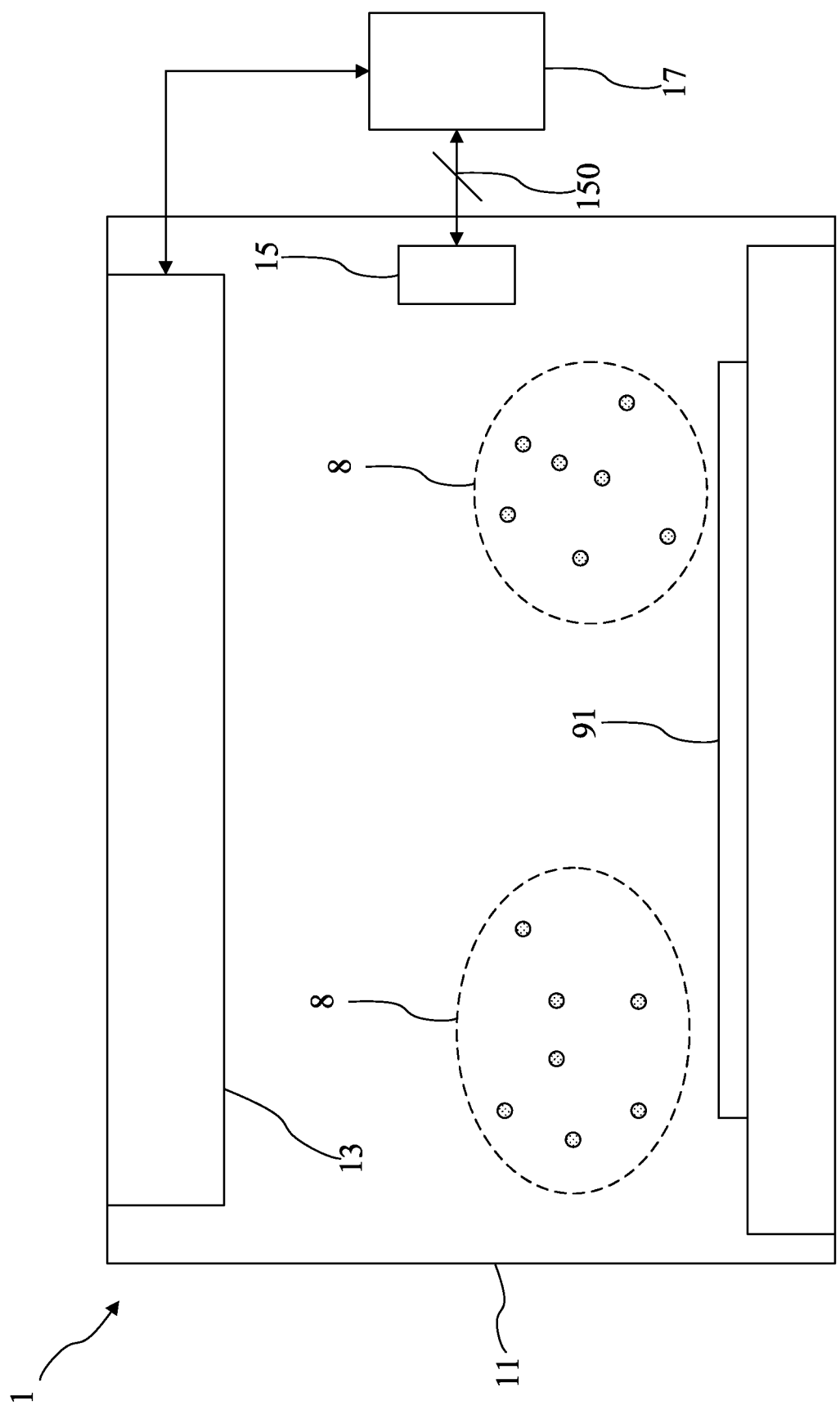
FIGS. 1A to 1C are schematic views of processing semiconductor wafer with a system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1B:
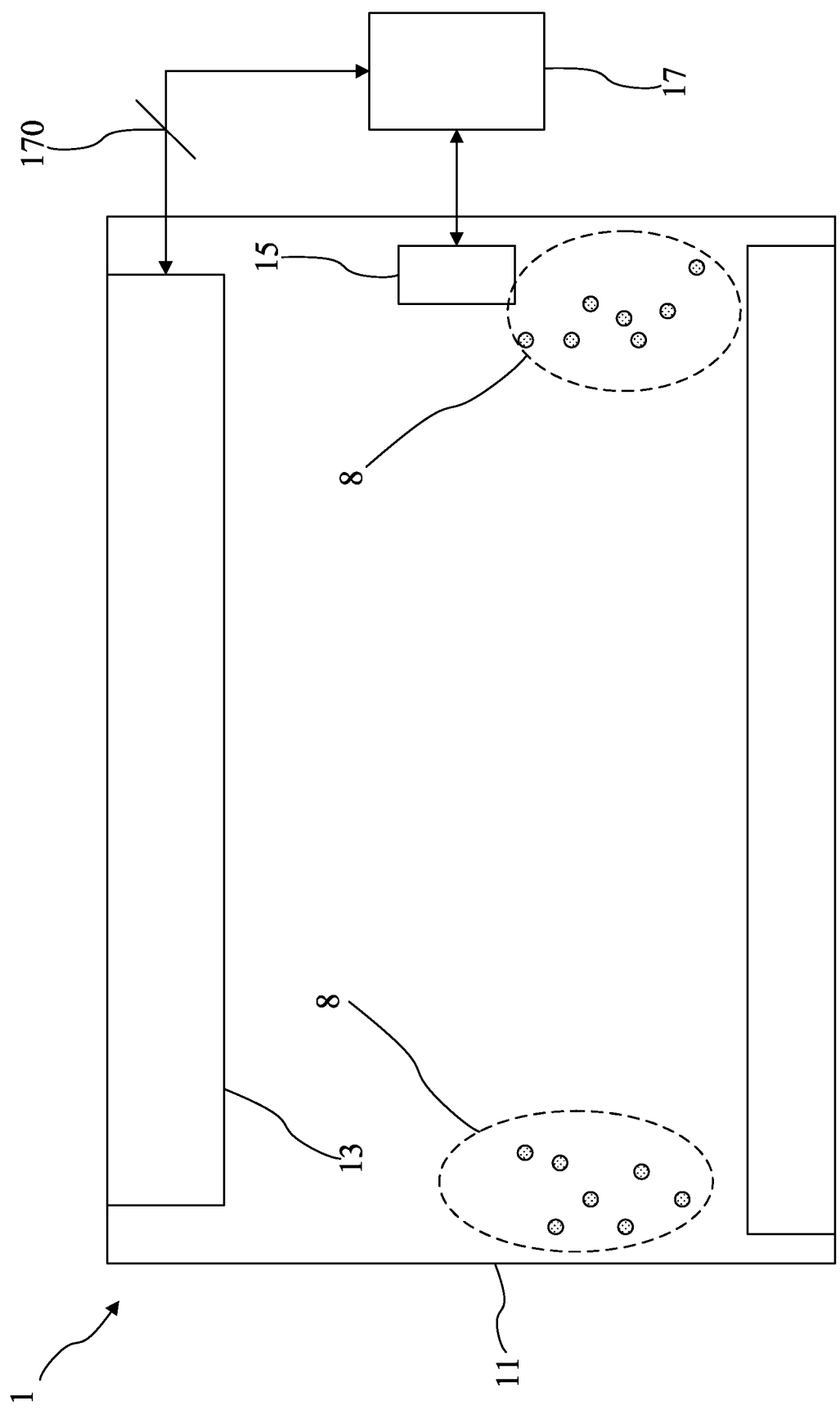
Figure 1C:
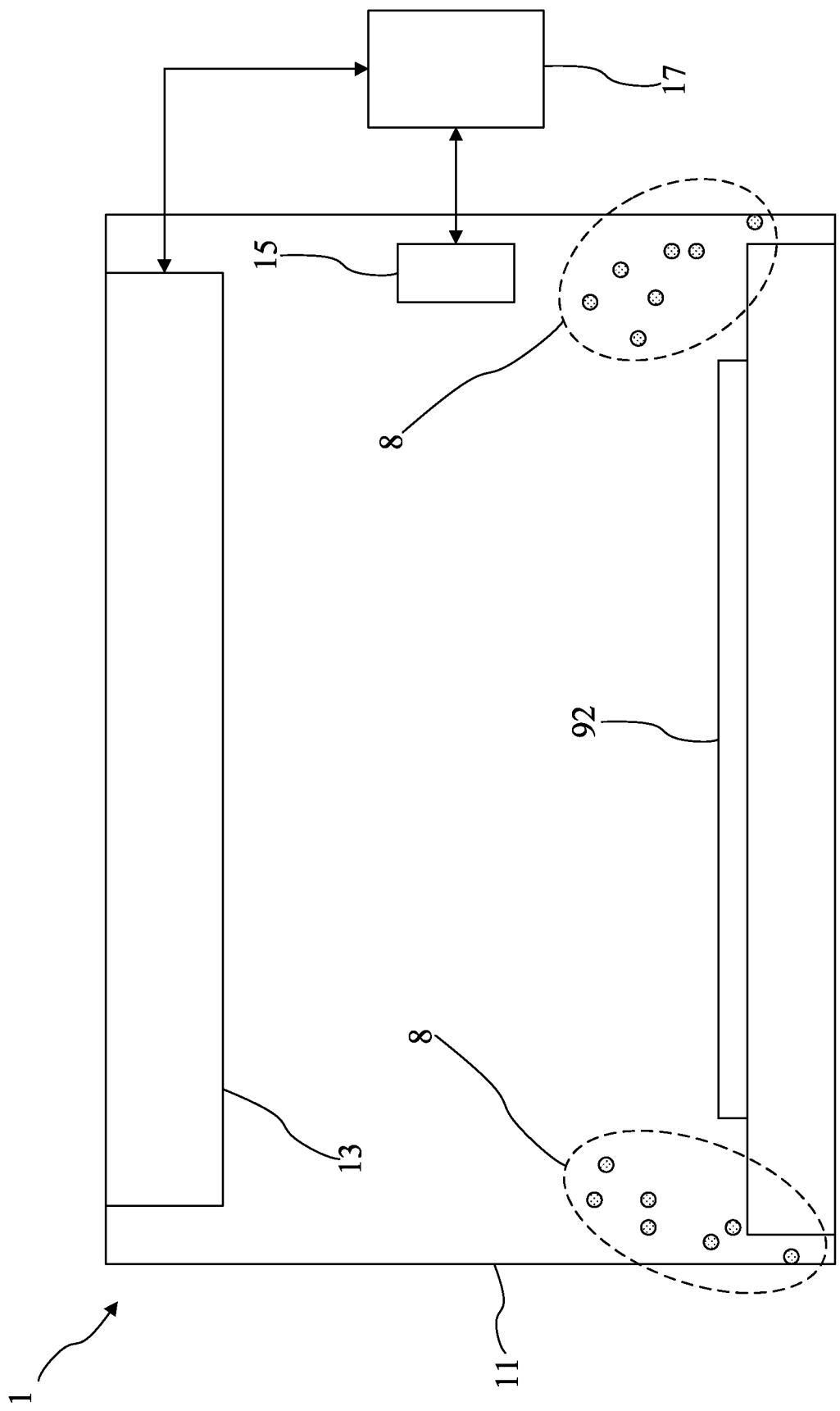

Referring to FIGS. 1A to 1C for some embodiments of the present disclosure, FIGS. 1A to 1C are schematic views of processing semiconductor wafers with a system 1 according to some embodiments of the present disclosure.

In some embodiments, the system 1 may include a chamber 11, at least one device 13, at least one sensor 15 and a controller 17. The chamber 11 may receive a wafer 91. The at least one device 13 may be disposed with the chamber 11. The at least one sensor 15 may be disposed with the chamber 11. The controller 17 may electrically connected with the at least one device 13 and the at least one sensor 15.

As shown in FIG. 1A, when the wafer 91 is processed in the chamber 11, the at least one sensor 15 may be used to sense a plurality of particles 8 in the chamber 11. In other words, the at least one sensor 15 may be used to monitor a distribution (or status) of the plurality of particles 8 in the chamber 11. The at least one sensor 15 may generate sensing data 150 according to the distribution (or status) of the plurality of particles 8. The at least one sensor 15 may transmit the sensing data 150 to the controller 17.

The controller 17 may receive the sensing data 150. The controller 17 may determine at least one parameter (not shown) for controlling the at least one device 13 according to the sensing data 150. In other words, the controller 17 may determine the at least one parameter for controlling the at least one device 13 according to the distribution of the plurality of particles 8. Bases on the at least one parameter, the controller 17 may transmit at least one controlling signal 170 to the at least one device 13 to configure the at least one device 13.

As shown in FIG. 1B, the at least one device 13 may receive the at least one controlling signal 170. After the wafer 91 is removed from the chamber 11, the at least one device 13 may operate according to the at least one controlling signal 170 to change at least one condition in the chamber 11. Based on the operations of the at least one device 13 according to the at least one controlling signal 170, the distribution (or status) of the plurality of particles 8 in the chamber 11 may be changed.

In some embodiments, after the operations of the at least one device 13 according to the at least one controlling signal 170, the plurality of particles 8 may be purged out from the chamber 11. In some embodiments, after the operations of the at least one device 13 according to the at least one controlling signal 170, the plurality of particles 8 may be moved away from a region for loading wafers.

Accordingly, as shown in FIG. 1C, when another wafer 92 is received in the chamber 11, the plurality of particles 8 may be prevent from being accumulated onto the wafer 92 because the distribution (or status) of the plurality of particles 8 in the chamber 11 is changed. The wafer 92 may be processed based on a recipe (not shown) after the at least one device 13 operates according to the at least one controlling signal 170.

Figure 2A:
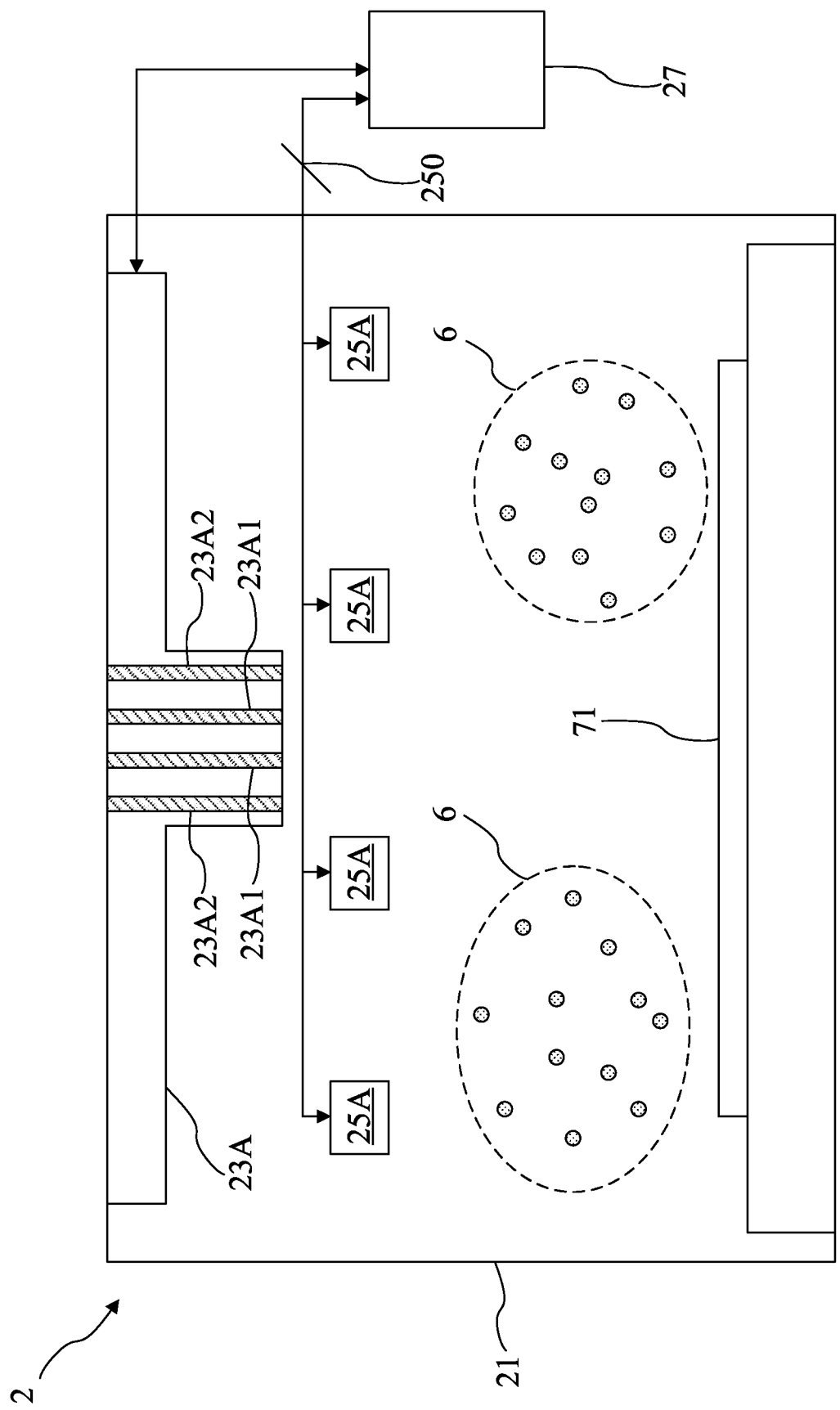
FIGS. 2A to 2C are schematic views of processing semiconductor wafer with a system according to some embodiments of the present disclosure.
Figure 2B:
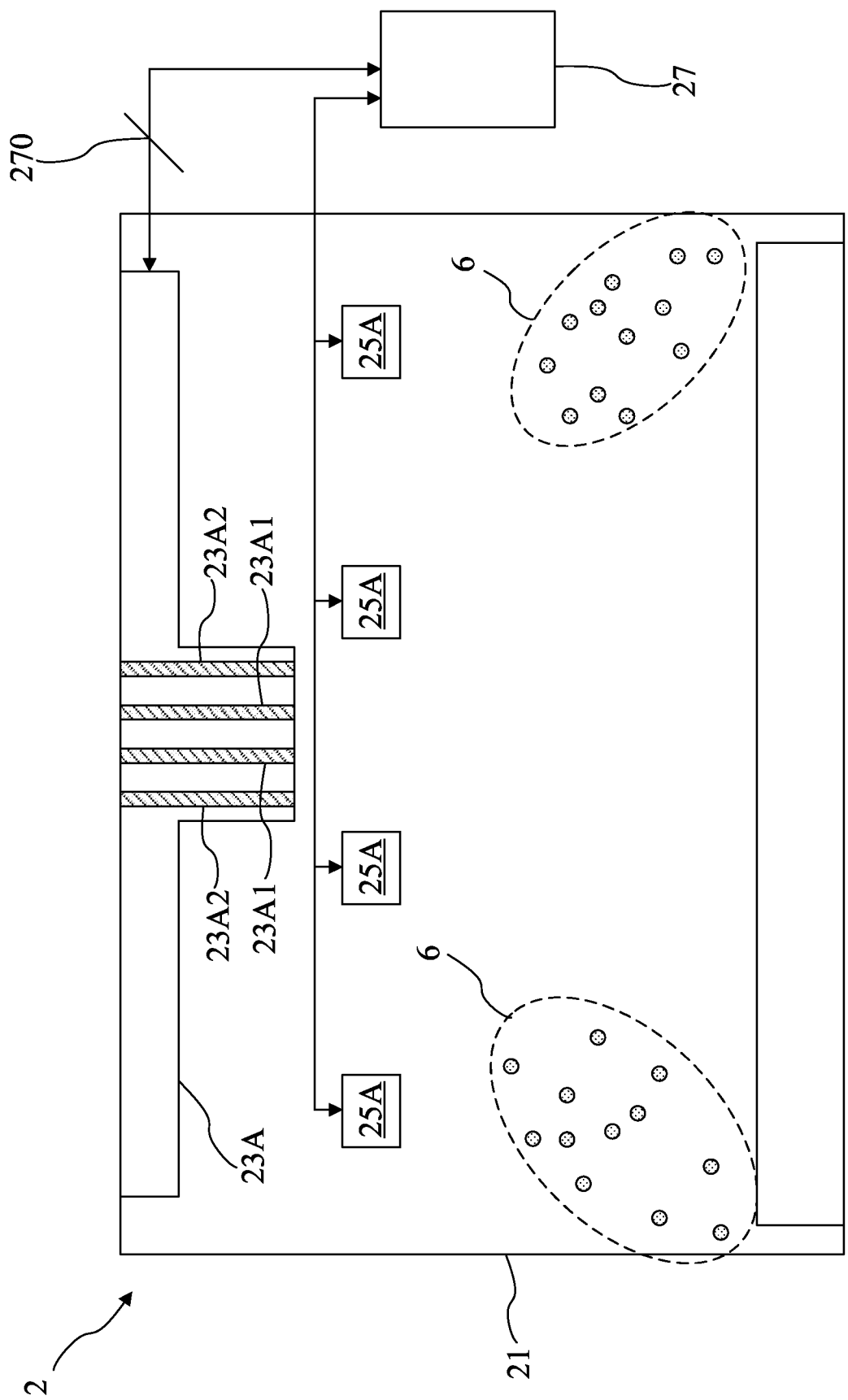
Figure 2C:
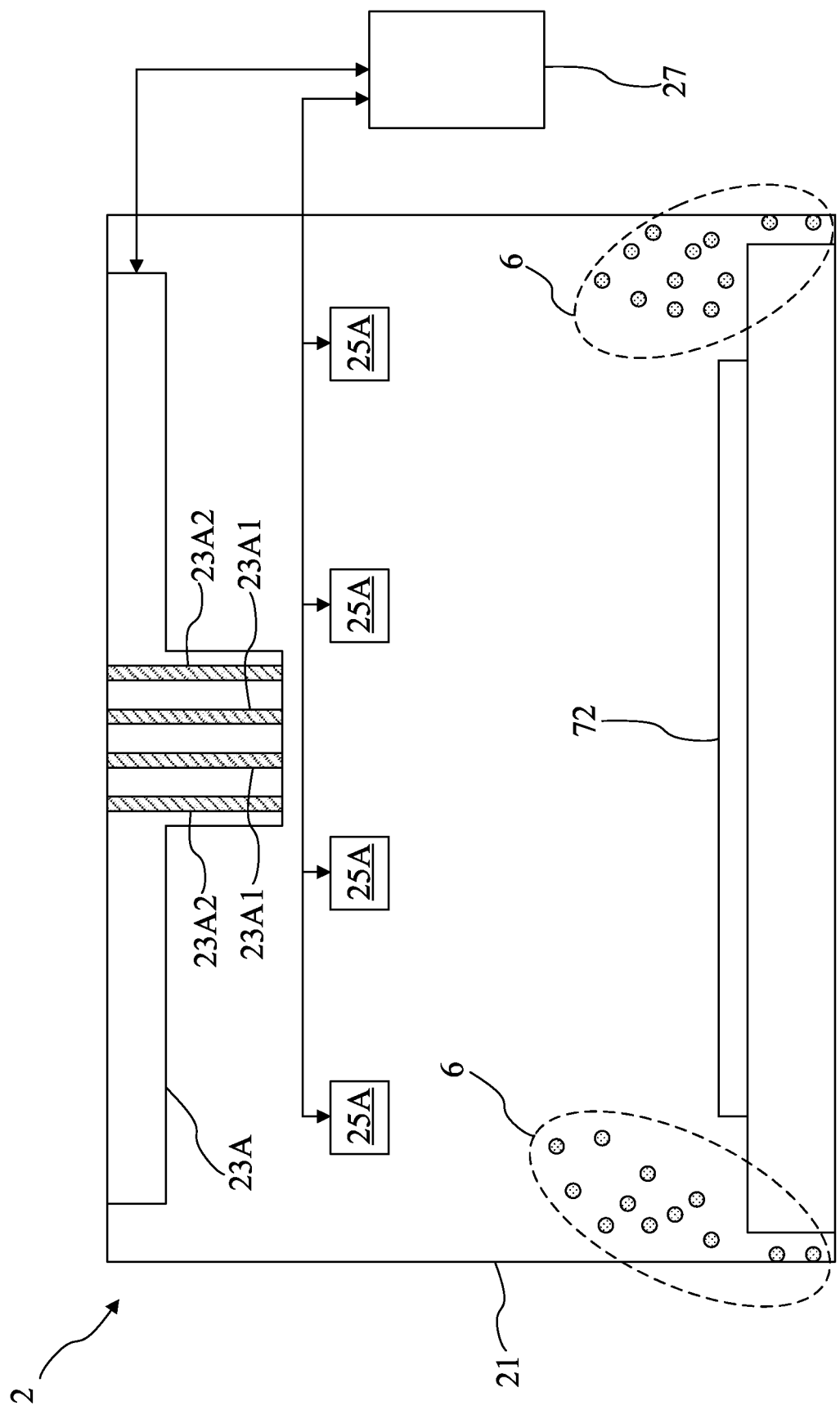

Referring to FIGS. 2A to 2C for some embodiments of the present disclosure, FIGS. 2A to 2C are schematic views of processing semiconductor wafer with a system 2 according to some embodiments of the present disclosure.

In some embodiments, the system 2 may include a chamber 21, at least one device, at least one sensor and a controller 27. The chamber 21 may receive a wafer 71. The at least one device may be disposed with the chamber 21. The at least one sensor may be disposed with the chamber 21. The controller 27 may electrically connected with the at least one device and the at least one sensor. In these embodiments, the at least one device may include a gas source 23A. The gas source 23A may provide a gas via inner nozzles 23A1 and outer nozzles 23A2. The at least one sensor may include a plurality of light sensors 25A.

As shown in FIG. 2A, when the wafer 71 is processed in the chamber 21, the plurality of light sensors 25A may be used to sense a plurality of particles 6 in the chamber 21. In other words, the plurality of light sensors 25A may be used to monitor a distribution (or status) of the plurality of particles 6 in the chamber 21. The plurality of light sensors 25A may generate sensing data 250 according to the distribution (or status) of the plurality of particles 6. The plurality of light sensors 25A may transmit the sensing data 250 to the controller 27.

The controller 27 may receive the sensing data 250. The controller 27 may determine a density of the plurality of particles 6 within some areas in the chamber 21 according to the sensing data 250. In some embodiments, based on the lights emitted and detected by the plurality of light sensors 25A, the density of the plurality of particles 6 within the areas may be calculated because the plurality of particles 6 may block the light paths from light emitting elements of the plurality of light sensors 25A to detecting elements of the plurality of light sensors 25A.

When the detecting elements of the light sensors 25A detect more lights from the emitting elements of the light sensors 25A within the areas, it means that the number of the plurality of particles 6 may be less within the areas. Accordingly, the density of the plurality of particles 6 within the areas may be smaller. When the detecting elements of the light sensors 25A detect less lights from the emitting elements of the light sensors 25A within the areas, it means that the number of the plurality of particles 6 may be more within the areas. Accordingly, the density of the plurality of particles 6 within the areas may be greater.

The controller 27 may determine flow rate parameters (not shown) for controlling the gas source 23A according to the density of the plurality of particles 6 within the areas in the chamber 21. In other words, the controller 27 may determine the flow rate parameters according to the distribution (or status) of the plurality of particles 6. According to the flow rate parameters, the controller 27 may transmit at least one controlling signal 270 to the gas source 23A to configure flow rates of the gas provided by the gas source 23A.

As shown in FIG. 2B, the gas source 23A may receive the at least one controlling signal 270. After the wafer 71 is removed from the chamber 21, the gas source 23A may change the flow rates of providing the gas according to the at least one controlling signal 270 so that to change at least one condition in the chamber 21. Based on the changes of flow rates of the gas source 23A according to the controlling signal 270, the distribution (or status) of the plurality of particles 6 in the chamber 21 may be changed.

In some embodiments, after the changes of the flow rates of the gas source 23 according to the at least one controlling signal 270, the plurality of particles 6 may be purged out from the chamber 21. In some embodiments, after the changes of the flow rates of the gas source 23 according to the at least one controlling signal 270, the plurality of particles 6 may be moved away from a region for loading wafers.

Accordingly, as shown in FIG. 2C, when another wafer 72 is received in the chamber 21, the plurality of particles 6 may be prevent from being accumulated onto the wafer 72 because the distribution (or status) of the plurality of particles $ in the chamber 21 is changed. The wafer 72 may be processed based on a recipe (not shown) after the gas source 23 changes the flow rates of providing the gas according to the at least one controlling signal 270.

In some embodiments, according to different calculated densities of the plurality of particles 6 within different areas, the flow rates of the gas provided via the inner nozzles 23A1 and the outer nozzles 23A2 may be changed. For some examples, to purge some particles 6 within some areas, the flow rates of the gas provided via the inner nozzles 23A1 are adjusted to be smaller than the flow rates of the gas provided via the outer nozzles 23A2. For other examples, to purge some particles 6 within some areas, the flow rates of the gas provided via the inner nozzles 23A1 are adjusted to be greater than the flow rates of the gas provided via the outer nozzles 23A2.

Figure 3A:
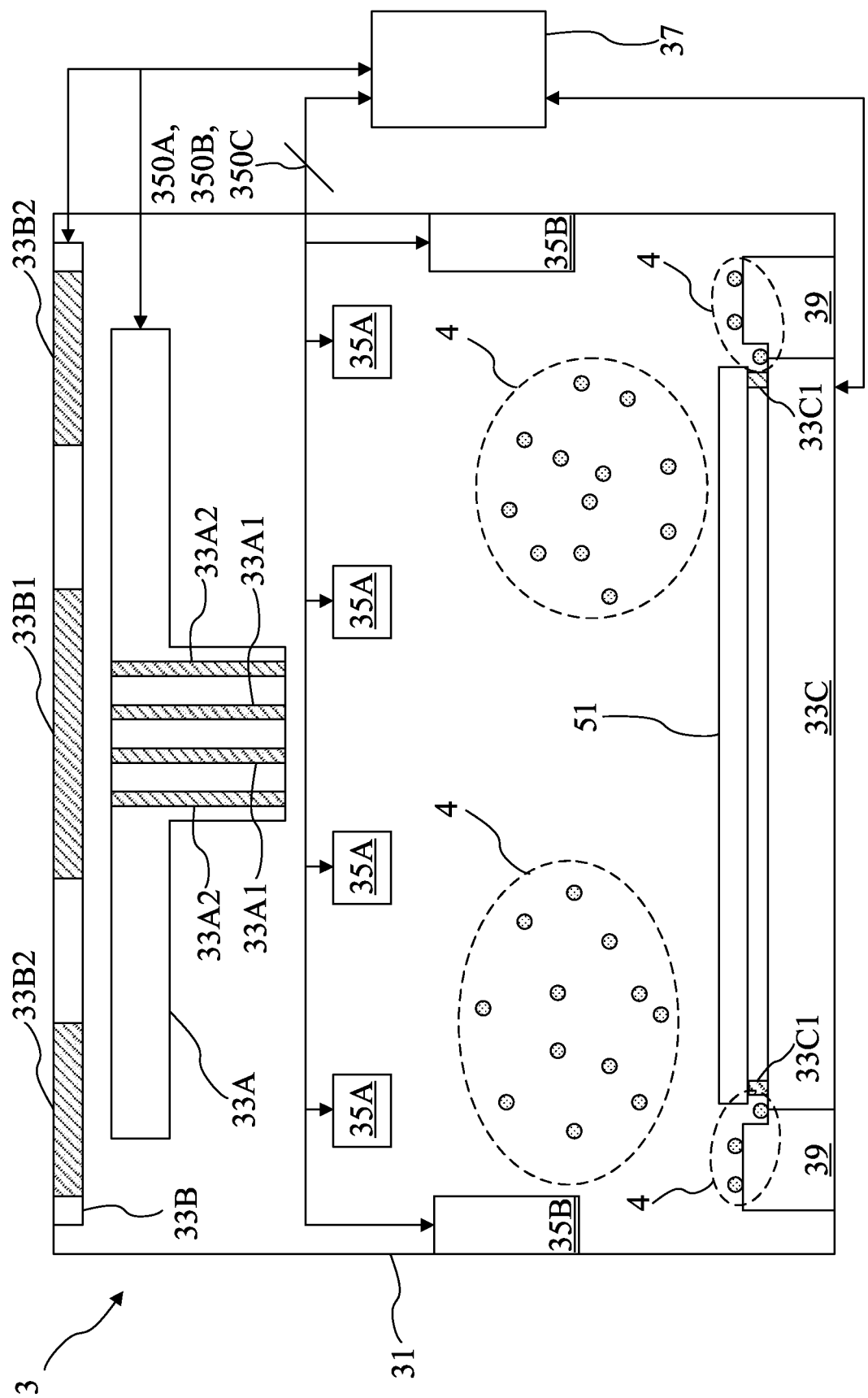
FIGS. 3A to 3C are schematic views of processing semiconductor wafer with a system according to some embodiments of the present disclosure.
Figure 3B:
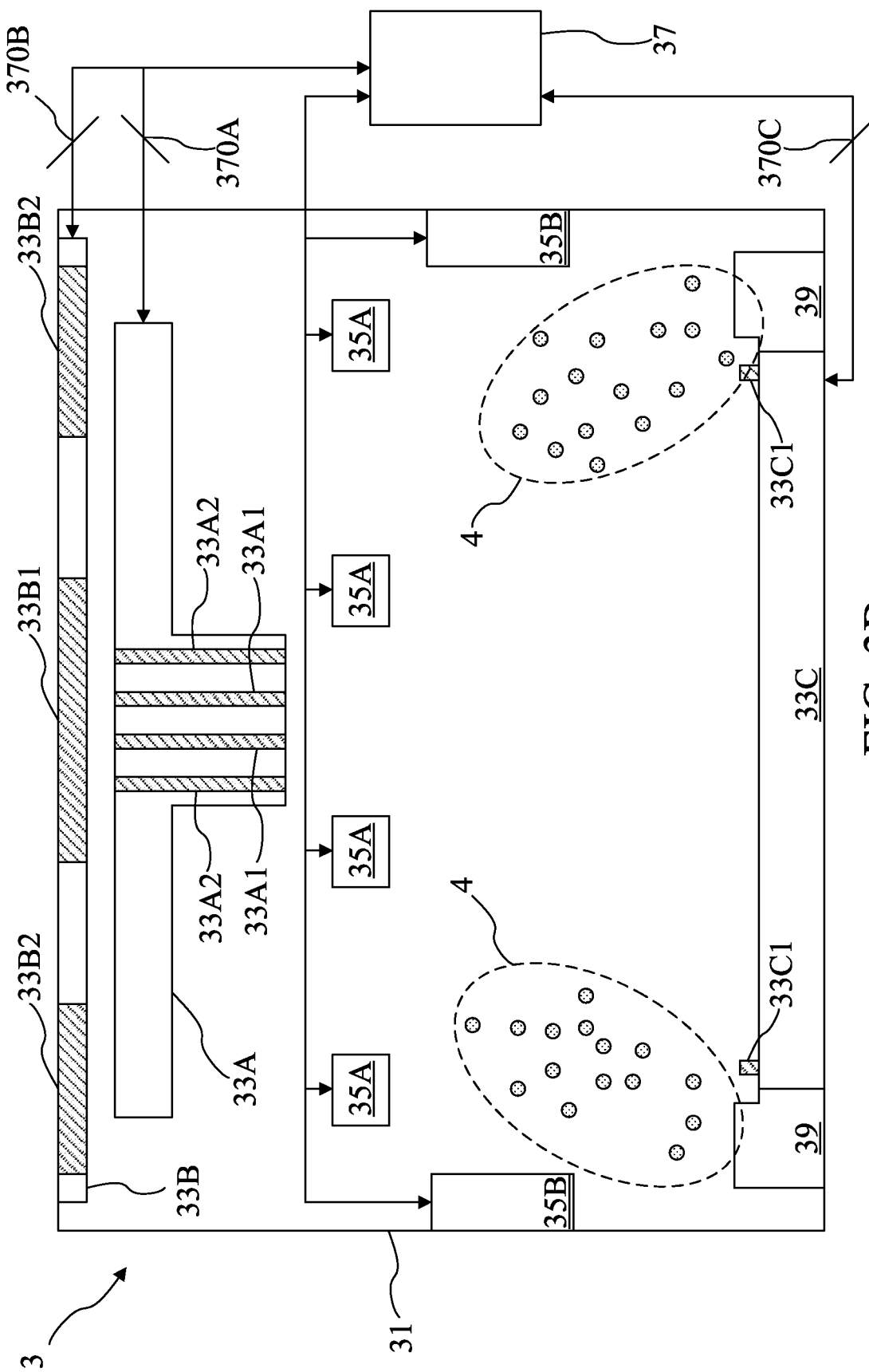
Figure 3C:
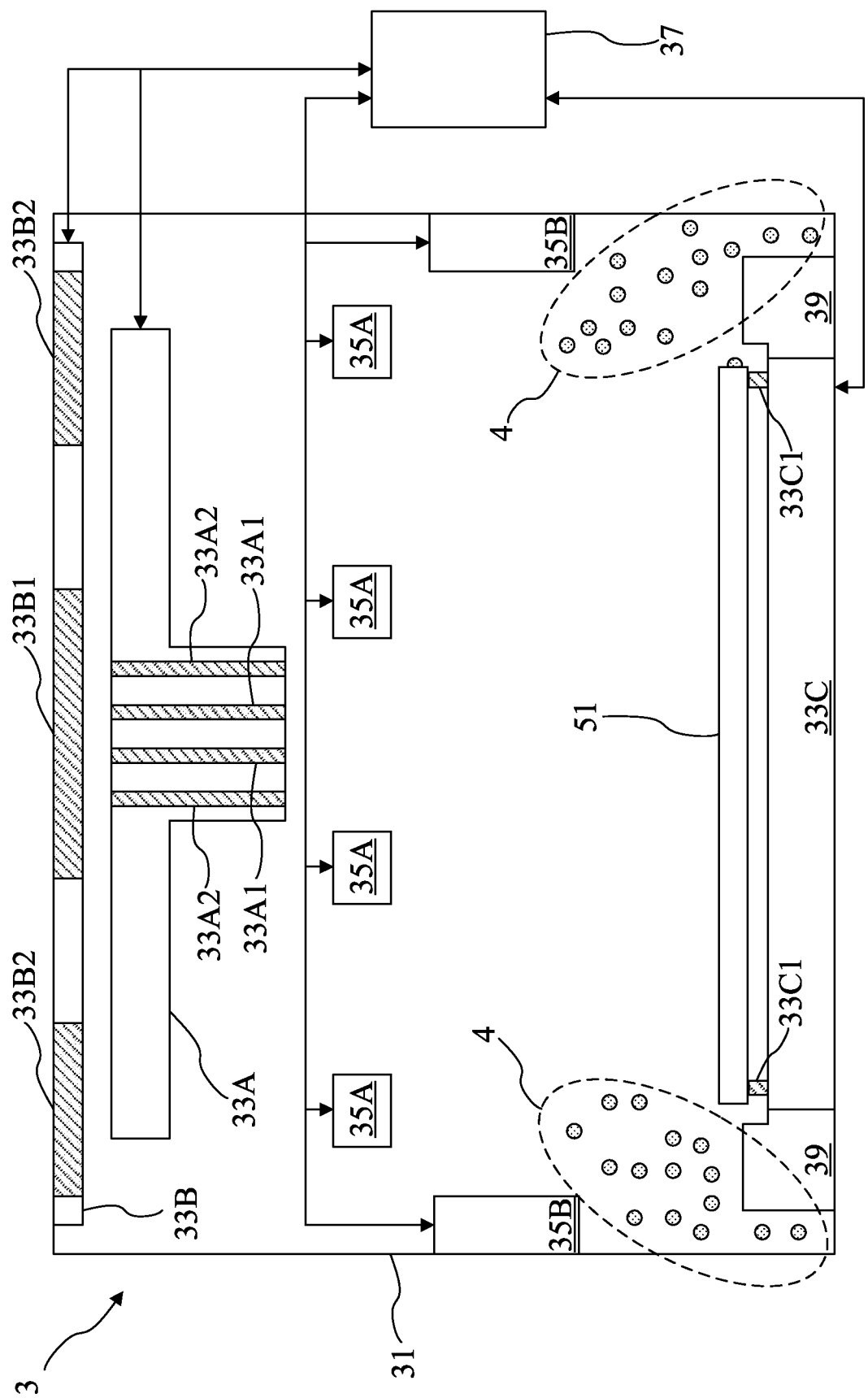

Referring to FIGS. 3A to 3C for some embodiments of the present disclosure, FIGS. 3A to 3C are schematic views of processing semiconductor wafer with a system 3 according to some embodiments of the present disclosure.

In some embodiments, the system 3 may include a chamber 31, at least one device, at least one sensor, a controller 37 and a single ring 39. The chamber 31 may receive a wafer 51. The at least one device may be disposed with the chamber 31. The at least one sensor may be disposed with the chamber 31. The controller 37 may electrically connected with the at least one device and the at least one sensor.

In these embodiments, the at least one device may include a gas source 33A, a plasma source 33B and a wafer chuck 33C. The gas source 33A may provide a gas via inner nozzles 33A1 and outer nozzles 33A2. The plasma source 33B may be used for performing a plasma etching procedure to the wafer 51. The plasma source 33B may include inner powers 33B1 and outer powers 33B2. The wafer chuck 33C may include an electrostatic chuck (ESC) for chucking wafers. The wafer chuck 33C and the single ring 39 may be used for loading the wafer 51. The wafer chuck 33C may have pins 33C1 for lifting and lowering the wafer 51. The at least one sensor may include a plurality of light sensors 35A and a plurality of cameras 35B.

As shown in FIG. 3A, when the wafer 51 is processed under the plasma etching procedure in the chamber 31, the plurality of light sensors 35A may be used to sense a plurality of particles 4 in the chamber 31 and the plurality of cameras 35B may be used to record flows of the plurality of particles 4 in the chamber 31. In other words, the plurality of light sensors 35A and the plurality of cameras 35B may be used to monitor a distribution (or status) of the particles 4 in the chamber 31.

The plurality of light sensors 35A may generate sensing data 350A according to the distribution (or status) of the plurality of particles 4. The plurality of light sensors 35A may transmit the sensing data 350A to the controller 37. The plurality of cameras 35B may generate video data 350B according to the distribution (or status) of the plurality of particles 4. The plurality of cameras 35B may transmit the video data 350B to the controller 37.

The controller 37 may receive the sensing data 350A. The controller 37 may determine a density of the plurality of particles 4 within some areas in the chamber 31 according to the sensing data 350A. In some embodiments, based on the lights emitted and detected by the plurality of light sensors 35A, the density of the plurality of particles 4 within the areas may be calculated because the plurality of particles 4 may block the light paths from light emitting elements of the plurality of light sensors 35A to detecting elements of the plurality of light sensors 35A.

When the detecting elements of the light sensors 35A detect more lights from the emitting elements of the light sensors 35A within the areas, it means that the number of the plurality of particles 4 may be less within the areas. Accordingly, the density of the plurality of particles 4 within the areas may be smaller. When the detecting elements of the light sensors 35A detect less lights from the emitting elements of the light sensors 35A within the areas, it means that the number of the plurality of particles 4 may be more within the areas. Accordingly, the density of the plurality of particles 4 within the areas may be greater.

The controller 37 may receive the video data 350B which records the flows of the plurality of particles 4 in the chamber 31. The controller 37 may determine a flow filed of the particles 4 within some areas in the chamber 31 according to the video data 3503.

The controller 37 may determine flow rate parameters (not shown) and plasma power parameters (not shown) for controlling the gas source 33A and the plasma source 33B according to the density and the flow filed of the plurality of particles 4 within the areas in the chamber 31. In other words, the controller 37 may determine the flow rate parameters and the plasma power parameters according to the distribution (or status) of the plurality of particles 4.

According to the flow rate parameters, the controller 37 may transmit at least one controlling signal 370A to the gas source 33A to configure flow rates of the gas provided by the gas source 33A. According to the plasma power parameters, the controller 37 may transmit at least one controlling signal 370B to the plasma source 33B to configure powers of the plasma source 33B.

As shown in FIG. 3B, the gas source 33A may receive the at least one controlling signal 370A. The plasma source 33B may receive the at least one controlling signal 370B. After the wafer 51 is removed from the chamber 31, the gas source 33A may change the flow rates of providing the gas according to the at least one controlling signal 370A and the plasma source 33B may change the powers according to the at least one controlling signal 370B so that to change at least one condition in the chamber 31.

Based on the change of the flow rates of the gas source 33A according to the at least one controlling signal 370A and the change of the powers of the plasma source 33B according to the at least one controlling signal 370B, the distribution (or status) of the plurality of particles 4 in the chamber 31 may be changed.

In some embodiments, after the changes of the flow rates of the gas source 33A according to the at least one controlling signal 370A, the plurality of particles 4 may be purged out from the chamber 31. In some embodiments, after the changes of the flow rates of the gas source 33A according to the at least one controlling signal 370A, the plurality of particles 4 may be moved away from a region for loading wafers. In some embodiments, after the changes of the powers of the plasma source 33B according to the at least one controlling signal 370B, the plurality of particles 4 within some areas may be suspended in the chamber 21 so that the suspended particles 4 may be purged out more easily.

Accordingly, as shown in FIG. 3C, when another wafer 52 is received in the chamber 31, the plurality of particles 4 may be prevent from being accumulated onto the wafer 52 because the distribution (or status) of the plurality of particles 4 in the chamber 31 is changed. The wafer 52 may be processed based on a recipe (not shown) after the gas source 33A changes the flow rates of providing the gas according to the at least one controlling signal 370A and the plasma source 33B changes the powers according to the at least one controlling signal 370B.

In some embodiments, corresponding to some combinations of different calculated densities and different flow fields of the plurality of particles 4 within different areas, the flow rates of the gas provided via the inner nozzles 33A1 and the outer nozzles 33A2 may be changed and the powers of the inner power 33B1 and the outer 33B2 may be changed.

For some examples, to purge some particles 4 within some areas, the flow rates of the gas provided via the inner nozzles 33A1 are adjusted to be smaller than the flow rates of the gas provided via the outer nozzles 33A2. To purge some particles 4 within some other areas, the flow rates of the gas provided via the inner nozzles 33A1 are adjusted to be greater than the flow rates of the gas provided via the outer nozzles 33A2.

For some examples, some particles 4 are electrically adhered on: (1) the wafer chuck 33C; (2) the single ring 39; and (3) an edge between the wafer chuck 33C and the single ring 39 within some areas. The powers of the inner power 33B1 and the outer power 33B2 are adjusted to prevent these particles 4 from being adhered on the wafer chuck 4, the single ring 39 and an edge between the wafer chuck 33C and the single ring 39 within the areas. In other words, the powers of the inner power 33B1 and the outer power 33B2 are adjusted to make the particles 4 within the areas suspended. Accordingly, the particles 4 can be purged by the gas more easily.

In some embodiments, technology of optical emission spectroscopy (OES) may be introduced for assisting the controller 37 to determine the parameters (e.g., flow rate parameters and plasma power parameters). Based on technology of OES, the light sensor 35A may detect variation of optical emissions caused by the plurality of particles 4 in the chamber 31 and generate sensing data 350C. The light sensor 35A may transmit the sensing data 350C to the controller 37C.

The controller 37 may receive the sensing data 350C and determine at least one element type of the plurality of particles 4 according to the sensing data 350C. The controller 37 may determine the parameters (e.g., flow rate parameters and plasma power parameters) according to the density, the flow field and the at least one element type of the plurality of particles 4.

For examples, when the at least one element type of some particles 4 is determined as Carbon (C), it means that these particles 4 could be by-product of the plasma etching procedure. These particles 4 could be centralized in the chamber 31 and electrically adhered on the center of the wafer chuck 33C. Accordingly, the powers of the inner power 33B1 are raised and the flow rates of the gas provided via the inner nozzles 33A1 are enlarged.

For examples, when the at least one element type of some particles 4 is determined as Silicon (Si), it means that these particles 4 could be generated around the edge between the wafer chuck 33C and the single ring 39. These particles 4 could be electrically adhered on the edge between the wafer chuck 33C and the single ring 39. Accordingly, the powers of the outer power 33B1 are raised and the flow rates of the gas provided via the outer nozzles 33A1 are enlarged.

In some embodiments, the pins 33C1 of the wafer chuck 31 may be used to lift or lower the loaded wafer. To prevent a mechanism of pins 33C1 from causing a turbulence of nearby particles 4 during the procedure of lifting or lowering the loaded wafer, a velocity and an execution order of lifting or lowering the pins 33C1 may be adjusted.

The controller 37 may determine velocity parameters (not shown) and an execution order (not shown) for controlling the pins 3301 according to the density and the flow filed of the plurality of particles 4 within some areas in the chamber 31. In other words, the controller 37 may determine the velocity parameters and the execution order according to the distribution (or status) of the plurality of particles 4. According to the velocity parameters and the execution order, the controller 37 may transmit at least one controlling signal 370C to the wafer chuck 33C to configure a moving velocity and a moving timing of lifting or lowering pins 33C1 of the wafer chuck 33C.

The wafer chuck 33C may receive the at least one controlling signal 370C. During the procedure of chucking/de-chucking the wafers 51 and 52, the wafer chuck 33C may lift or lower the pins 33C1 as the moving velocity and at the moving timing to prevent the mechanism of pins 33C1 from causing the turbulence of nearby particles 4.

Figure 4:
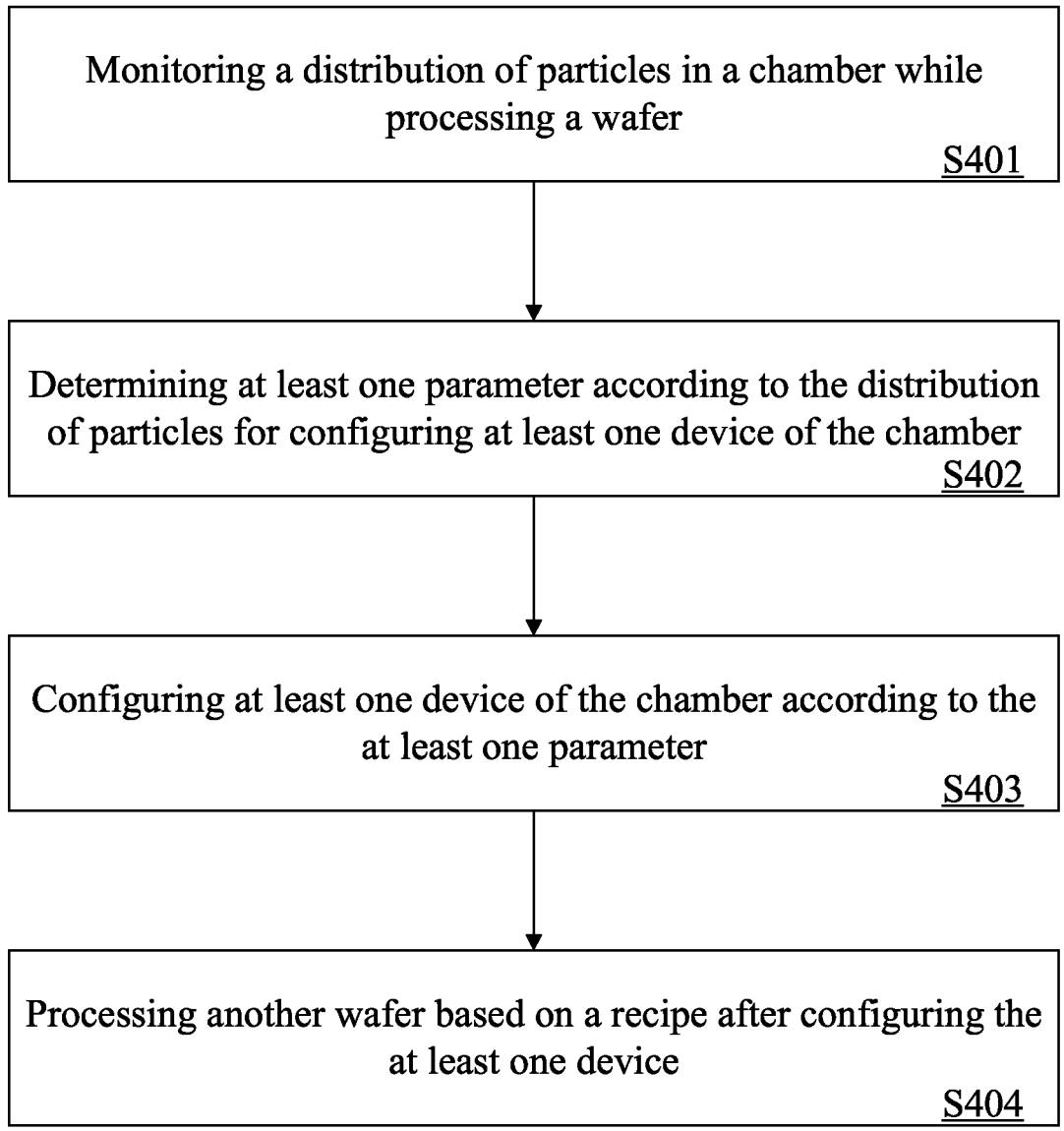
FIG. 4 is a flowchart diagram according to some embodiments of the present disclosure.

Some embodiments of the present disclosure include a method for processing wafer, and a flowchart diagram thereof is as shown in FIG. 4. The method of some embodiments may be implemented by a system (e.g., the system 1, 2 or 3 of the aforesaid embodiments). Detailed operations of the method are as follows.

Operation S401 is performed to monitor a distribution of particles in a chamber while processing a wafer. Operation S402 is performed to determine at least one parameter according to the distribution of the particles. The at least one parameter are used tor configuring at least one device of the chamber. Operation S403 is performed to configure the at least one device of the chamber according to the at least one parameter. Operation S404 is performed to process another wafer based on a recipe after configuring the at least one device of the chamber.

Figure 5:
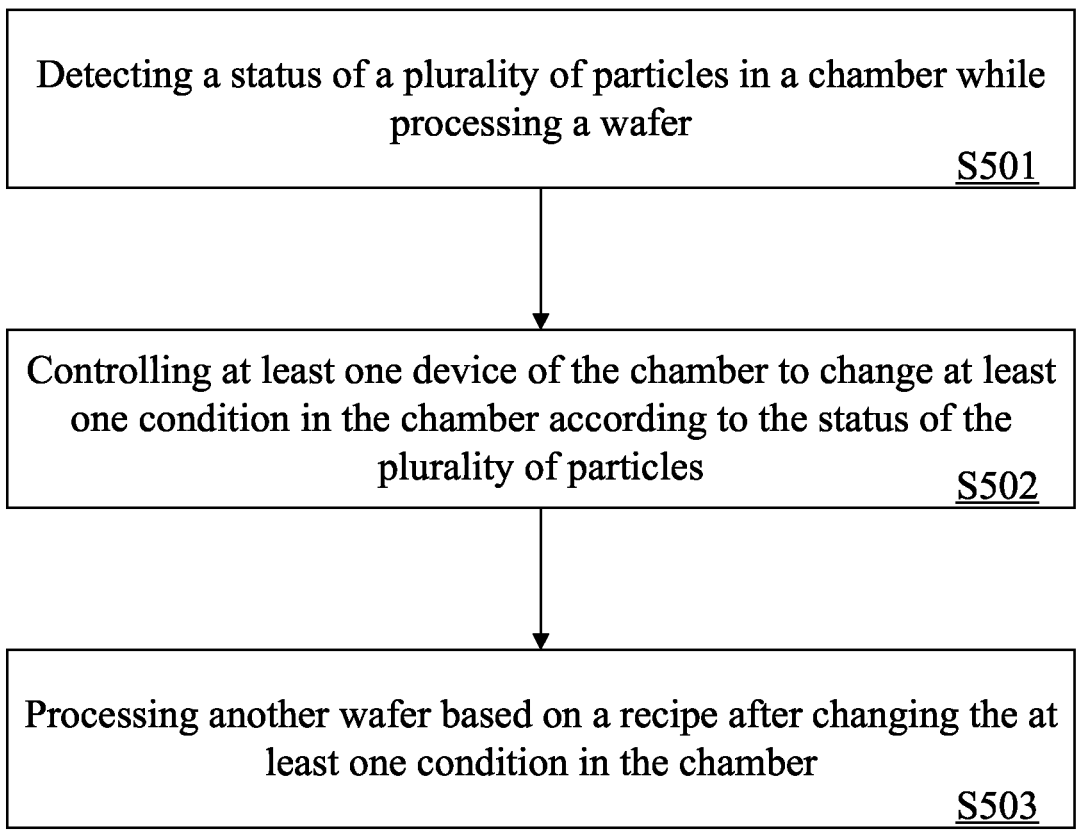
FIG. 5 is a flowchart diagram according to sore e embodiments of the present disclosure.

Some embodiments of the present disclosure include a method for processing wafer, and a flowchart diagram thereof is as shown in FIG. 5. The method of some embodiments may be implemented by a system (e.g., the system 1, 2 or 3 of the aforesaid embodiments). Detailed operations of the method are as follows.

Operation S501 is performed to detect a status of a plurality of particles in a chamber while processing a wafer. Operation S502 is performed to control at least one device of the chamber to change at least one condition in the chamber according to the status of the plurality of particles. Operation S503 is performed to process another wafer based on a recipe after changing at least one condition in the chamber.

In some embodiments, the status of the plurality of particles may include a flow field of the plurality of particles, a density of the plurality of particles and at least one element type of the plurality of particles. In some embodiments, the at least one condition includes a gas flow rate, a plasma power, a mechanism of pins of a wafer chuck, or any combination of the gas flow rate, the plasma power and the mechanism of pins of the wafer chuck.

Figure 6:
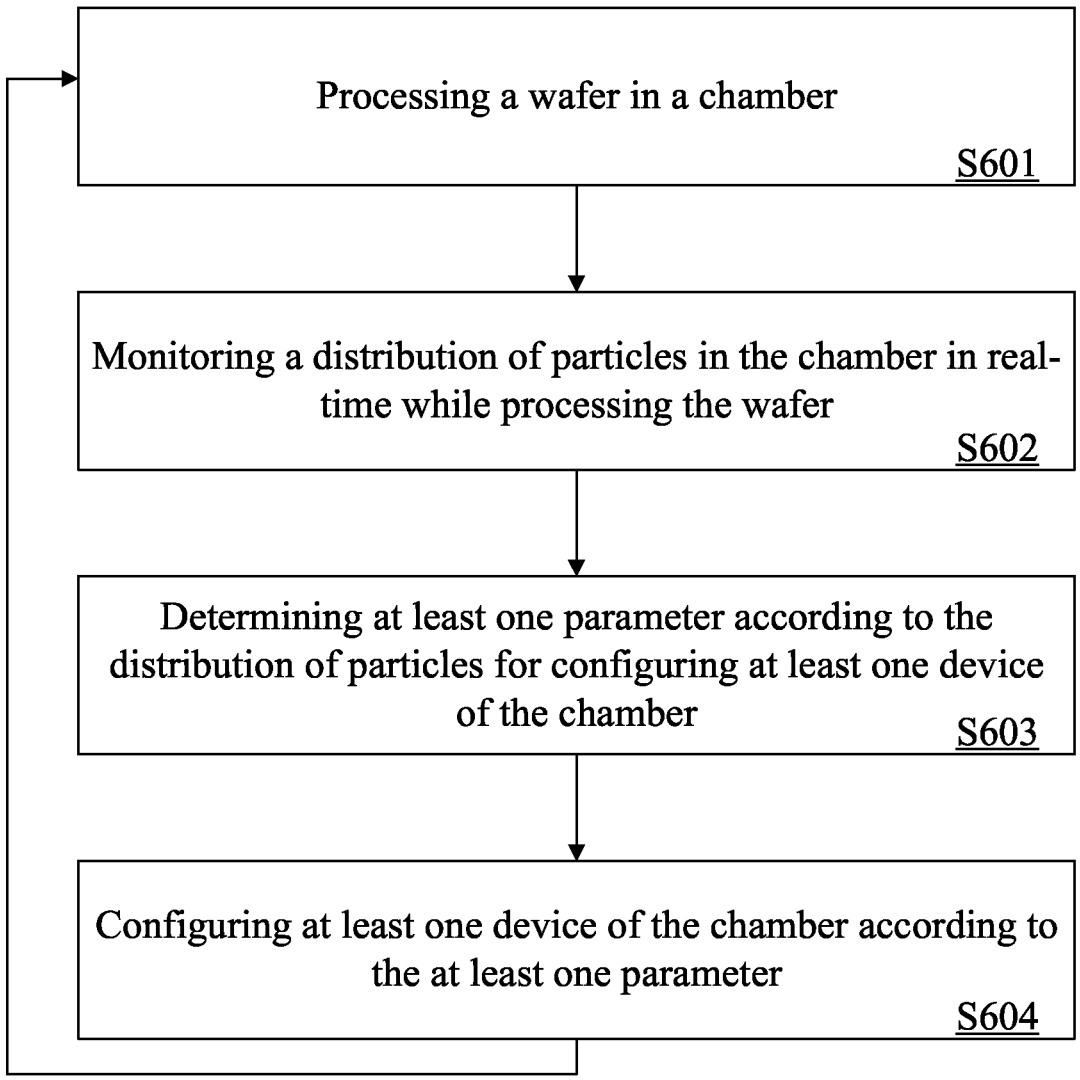
FIG. 6 is a flowchart diagram according to some embodiments of the present disclosure.

Some embodiments of the present disclosure include a method for processing wafer, and a flowchart diagram thereof is as shown in FIG. 6. The method of some embodiments may be implemented by a system (e.g., the system 1, 2 or 3 of the aforesaid embodiments). Detailed operations of the method are as follows.

Operation S601 is performed to process a wafer in a chamber. Operation S602 is performed to monitor a distribution of particles in a chamber in real-time while processing the wafer. In some embodiments, the distribution of the particles may include a density of the particles within an area in the chamber. In some embodiments, the distribution of the particles may include a movement (i.e., a flow filed) of the particles in the chamber. In some embodiments, the distribution may include both the density and the movement of the particles.

Operation S603 is performed to determine at least one parameter according to the distribution of the particles. The at least one parameter are used for configuring at least one device of the chamber. Operation S604 is performed to configure the at least one device of the chamber according to the at least one parameter before processing another wafer. Operation S601 is repeatedly performed to process next wafer.

In some embodiments, the at least one device may include a gas source having inner nozzles and outer nozzles. The at least one parameter may include flow rate parameters for configuring the gas source to: (1) change a flow rate of a gas provided via the inner nozzles; and (2) change a flow rate of the gas provided via the outer nozzles.

In some embodiments, the at least one device may include a plasma source having inner powers and outer powers. The at least one parameter may include plasma power parameters for configuring the plasma source to: (1) change a power of the inner powers; and (2) change a power of the outer powers.

In some embodiments, the at least one device may include both the gas source and the plasma source. The at least one parameter may include the flow rate parameters and the plasma power parameters for configuring the gas source and the plasma source.

Figure 7:
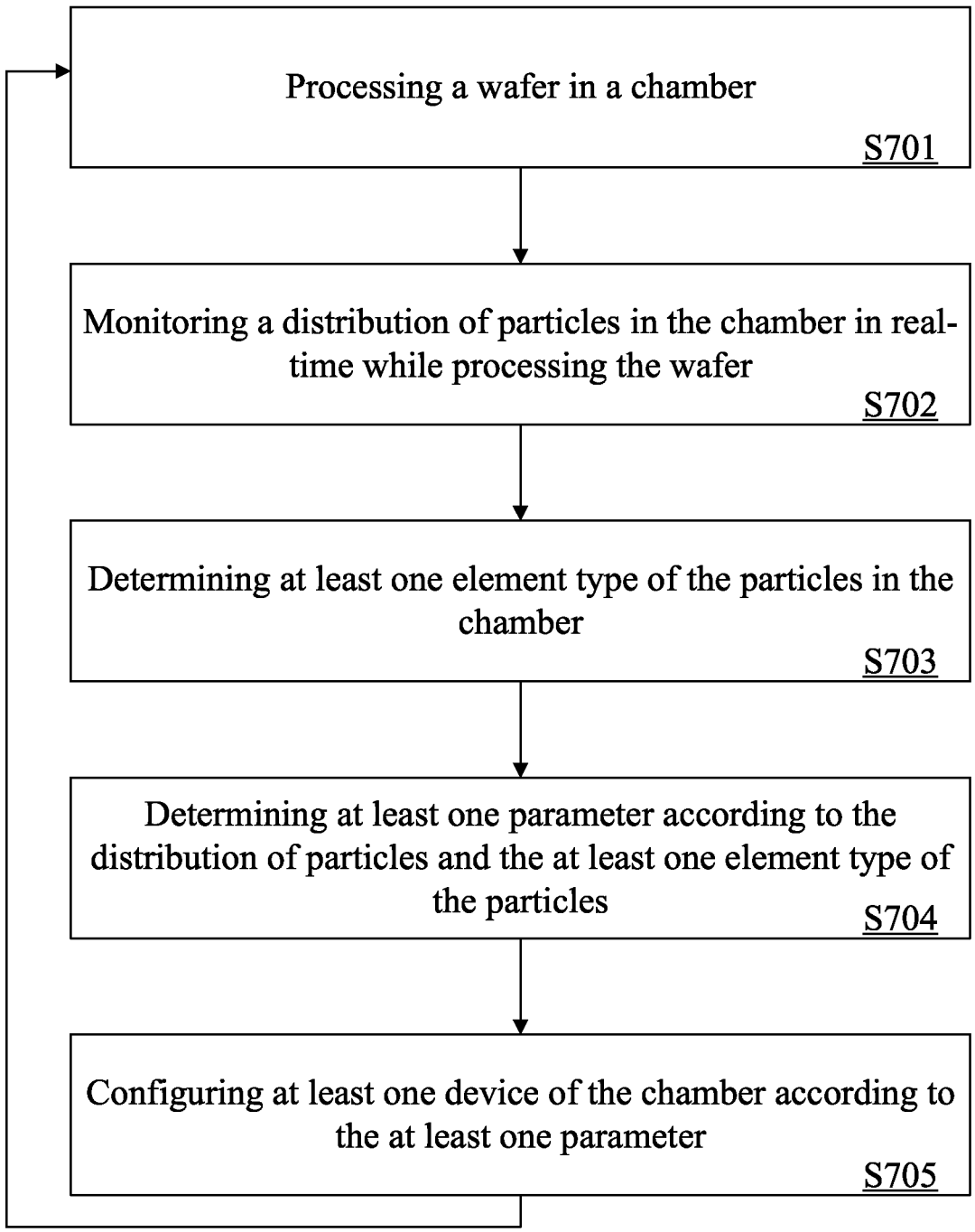
FIG. 7 is a flowchart diagram according to some embodiments of the present disclosure.

Some embodiments of the present disclosure include a method for processing wafer, and a flowchart diagram thereof is as shown in FIG. 7. The method of some embodiments may be implemented by a system (e.g., the system 1, 2 or 3 of the aforesaid embodiments). Detailed operations of the method are as follows.

Operation S701 is performed to process a wafer in a chamber. Operation S702 is performed to monitor a distribution of particles in a chamber while processing the wafer. In some embodiments, the distribution of the particles may include a density of the particles within an area in the chamber. In some embodiments, the distribution of the particles may include a movement (i.e., a flow filed) of the particles in the chamber. In some embodiments, the distribution may include both the density and the movement of the particles.

Operation S703 is performed to determine at least one element type of the particles in the chamber. Operation S704 is performed to determine at least one parameter according to the distribution of the particles and the at least one element type of the particles. The at least one parameter are used for configuring at least one device of the chamber. Operation S705 is performed to configure the at least one device of the chamber according to the at least one parameter before processing another wafer. Operation S701 is repeatedly performed to process next wafer.

In some embodiments, the at least one device may include a gas source having inner nozzles and outer nozzles. The at least one parameter may include flow rate parameters for configuring the gas source to: (1) change a flow rate of a gas provided via the inner nozzles; and (2) change a flow rate of the gas provided via the outer nozzles.

In some embodiments, the at least one device may include a plasma source having inner powers and outer powers. The at least one parameter may include plasma power parameters for configuring the plasma source to: (1) change a power of the inner powers; and (2) change a power of the outer powers.

In some embodiments, the at least one device may include a wafer chuck having pins. The at least one parameter may include velocity parameters and execution order for configuring: (1) a moving velocity of the pins of the wafer chuck; and (2) a moving timing of the pins of the wafer chuck.

In some embodiments, the at least one device may include the gas source, the plasma source and the wafer chuck at the same time. The at least one parameter may include the flow rate parameters, the plasma power parameters, the velocity parameters and execution order for configuring the gas source, the plasma source and the pins of the wafer chuck.

Some embodiments of the present disclosure provide a method for processing wafer. The method includes the operations of: monitoring a distribution of particles in a chamber while processing the wafer; determining at least one parameter according to the distribution of the particles for configuring at least one device of the chamber; configuring the at least one device of the chamber according to the at least one parameter; and processing another wafer based on a recipe after configuring the at least one device of the chamber.

Some embodiments of the present disclosure provide a method of processing wafer. The method includes the operations of: detecting a status of a plurality of particles in a chamber while processing the wafer; controlling at least one device of the chamber to change at least one condition in the chamber according to the status of the plurality of particles; and processing another wafer based on a recipe after changing at least one condition in the chamber.

Some embodiments of the present disclosure provide a system for processing wafer. The system includes a chamber, at least one device, at least one sensor and a controller. The chamber is for receiving the wafer. The at least one device is disposed with the chamber. The at least one sensor is disposed with the chamber for sensing a plurality of particles in the chamber to generate sensing data while processing the wafer. The controller is electrically connected with the at least one device and the at least one sensor for: determining at least one parameter according to sensing data; and configuring the at least one device of the chamber according to the at least one parameter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the resent disclosure.

What is claimed is:

1. A method for processing a wafer, comprising:
monitoring a distribution of particles in a chamber while processing the wafer;
determining at least one parameter according to the distribution of the particles for configuring at least one device of the chamber, wherein the at least one parameter includes a first flow rate parameter and a second flow rate parameter, and the at least one device include a gas source having an inner nozzle and an outer nozzle;
configuring the at least one device of the chamber according to the at least one parameter, wherein the gas source is configured to change a flow rate of a gas provided via the inner nozzle according to the first flow rate parameter, and change a flow rate of a gas provided via the outer nozzle according to the second flow rate parameter; and
processing another wafer based on a recipe after configuring the at least one device of the chamber.

2. The method of claim 1, wherein the step of monitoring the distribution of particles further comprises:
monitoring a density of particles within an area in the chamber.

3. The method of claim 1, wherein the step of monitoring the distribution of particles further comprises:
monitoring a movement of the particles in the chamber.

4. The method of claim 1, further comprising:
determining at least one element type of the particles in the chamber;
wherein the step of determining the at least one parameter according to the distribution of the particles for configuring the at least one device of the chamber further comprises:
determining the at least one parameter according to the distribution of the particles and the at least one element type of the particles for configuring the at least one device of the chamber.

5. The method of claim 1, wherein the at least one parameter includes a plasma power parameter, the at least one device include a plasma source having an inner power, and the step of configuring the at least one device of the chamber according to the at least one parameter further comprises:
configuring the plasma source to change a power of the inner power according to the plasma power parameter.

6. The method of claim 1, wherein the at least one parameter includes a plasma power parameter, the at least one device include a plasma source having an outer power, and the step of configuring the at least one device of the chamber according to the at least one parameter further comprises:
configuring the plasma source to change a power of the outer power according to the plasma power parameter.

7. The method of claim 1, wherein the at least one parameter includes a velocity parameter, the at least one device include a pin of a wafer chuck, and the step of configuring the at least one device of the chamber according to the at least one parameter further comprises:
configuring a moving velocity of the pin of the wafer chuck according to the velocity parameter.

8. The method of claim 1, wherein the at least one parameter includes an execution order, the at least one device include a pin of a wafer chuck, and the step of configuring the at least one device of the chamber according to the at least one parameter further comprises:

configuring a moving timing of the pins of the wafer chuck according to the execution order.

9. A method of processing a wafer, comprising:
    detecting a status of a plurality of particles in a chamber while processing the wafer;
    controlling at least one device of the chamber to change at least one condition in the chamber according to the status of the plurality of particles, wherein the at least one condition includes a mechanism of pins of a wafer chuck; and
    processing another wafer based on a recipe after changing at least one condition in the chamber.

10. The method of claim 9, wherein the status of the plurality of particles includes a flow field of the plurality of particles, a density of the plurality of particles and at least one element type of the plurality of particles.

11. The method of claim 9, wherein the at least one condition further includes a gas flow rate, a plasma power, or any combination thereof.

12. The method of claim 9, wherein the mechanism of the pins of the wafer chuck includes a moving velocity of the pins of the wafer chuck.

13. The method of claim 9, wherein the mechanism of the pins of the wafer chuck includes a moving timing of the pins of the wafer chuck.

14. A system for processing a wafer, comprising:
    a chamber for receiving the wafer;
    at least one device disposed with the chamber;
    at least one sensor disposed with the chamber for sensing a plurality of particles in the chamber to generate sensing data while processing the wafer;
    a controller electrically connected with the at least one device and the at least one sensor for:
        determining at least one parameter according to sensing data;
        configuring the at least one device of the chamber according to the at least one parameter, wherein the at least one device includes a wafer chuck having pins and the at least one parameter includes a velocity parameter; and
        configuring a moving velocity of the pins of the wafer chuck according to the velocity parameter.

15. The system of claim 14, wherein the at least one device includes a plasma source, and a gas source.

16. The system of claim 15, wherein the at least one parameter includes a plasma power parameter, and the controller is for configuring a power of the plasma source according to the plasma power parameter.

17. The system of claim 15, wherein the at least one parameter includes a flow rate parameter, and the controller is for configuring a flow rate of a gas provided by the gas source according to the flow rate parameter.

18. The system of claim 15, wherein the at least one parameter includes an execution order, and the controller is for configuring a moving timing of the pins of the wafer chuck according to the execution order.

19. The system of claim 14, wherein the at least one sensor includes a plurality of light sensors, each of light sensor has light emitting element and light detecting element, and the controller is further for:
    determining a density of the plurality of particles within an area in the chamber according to sensing data; and
    determining the at least one parameter according to the density of the plurality of particles.

20. The system of claim 14, wherein the at least one sensor includes a camera, and the controller is further for:
    determining a flow field of the plurality of particles in the chamber according to sensing data; and
    determining the at least one parameter according to the flow field of the plurality of particles.

* * * * *